United States Patent [19]

Kurtz et al.

[11] Patent Number: 4,603,802
[45] Date of Patent: Aug. 5, 1986

[54] VARIATION AND CONTROL OF BOND FORCE

[75] Inventors: John A. Kurtz; Donald E. Cousens, both of Saco; Mark D. Dufour, Portland, all of Me.

[73] Assignee: Fairchild Camera & Instrument Corporation, Cupertino, Calif.

[21] Appl. No.: 584,084

[22] Filed: Feb. 27, 1984

[51] Int. Cl.[4] .................... B23K 1/06; B23K 20/10
[52] U.S. Cl. .................... 228/1.1; 228/102; 228/179; 228/110
[58] Field of Search .............. 228/1.1, 4.1, 7, 102, 228/179, 4.5, 110

[56] References Cited

U.S. PATENT DOCUMENTS

| | | | |
|---|---|---|---|
| 3,610,506 | 10/1971 | Robinson | 228/1.1 |
| 3,643,321 | 2/1972 | Field et al. | 29/470.1 |
| 3,696,985 | 10/1972 | Herring et al. | 228/1.1 |
| 4,098,447 | 7/1978 | Edson et al. | 228/4.5 |
| 4,323,759 | 4/1982 | Edson et al. | 219/137 PS |
| 4,390,771 | 6/1983 | Kurtz et al. | 219/56.22 |

FOREIGN PATENT DOCUMENTS 124240  9/1980  Japan ................... 228/4.5

*Primary Examiner*—Nicholas P. Godici
*Assistant Examiner*—Samuel M. Heinrich
*Attorney, Agent, or Firm*—Kenneth Olsen; Carl L. Silverman; Daniel H. Kane, Jr.

[57] ABSTRACT

A lead wire bonding machine is described for ball bonding the end of a lead wire held in a bonding tool to a die pad of an integrated circuit chip and for wedge bonding a segment of the lead wire spaced from the ball bond to a lead frame finger during successive ball bond wedge bond cycles. The bonding machine includes a variable linear drive such as a solenoid or small linear motor coupled to the bonding head for applying the first bond force to the bonding tool during ball bonding and the second bond force to the bonding tool during wedge bonding. A control circuit coupled to the solenoid or other variable linear drive delivers a first current having a desired profile or amplitude wave envelope for applying the first bond force with a first force profile during ball bonding to die pads and by delivering a second current having a desired profile or amplitude wave form for applying the second bond force with a second force profile during wedge bonding to lead frame fingers. A wave form generator generates the wave form envelopes for achieving the desired force profile so that the bond force may be varied according to the force profile during bonding at a particular site. Thus, the bond force may be varied and modulated according to the welding requirements at different die pads or lead frame fingers and according to the composition of the constituent metals of the lead wire and bonding substrate.

18 Claims, 10 Drawing Figures

VARIATION AND CONTROL OF BOND FORCE

CROSS REFERENCE TO RELATED APPLICATION

This invention is related to U.S. Pat. Application Ser. No. 584,083 entitled LEAD WIRE BONDING WITH INCREASED BONDING SURFACE AREA, filed concurrently on Feb. 27, 1984. The related application was filed by the present applicants, was assigned to the assignee of the present invention, and the contents thereof are incorporated herein by reference.

TECHNICAL FIELD

This invention relates to an improvement in lead wire bonding machines for bonding fine lead wires between an integrated circuit chip and the lead frame on which the chip is mounted for coupling to external circuitry. The invention provides a new method and apparatus for controlling and varying the bond force applied during ball bonding and wedge bonding. Ball bonding is used to weld the end of a lead wire held in the capillary bonding tool of the ball bonding machine to a die pad of an integrated circuit chip. Wedge bonding is used to weld a segment of the lead wire spaced from the ball bond to a lead frame finger.

BACKGROUND ART

The bonding or welding of lead wires between an integrated circuit chip or die and the lead frame on which the die is mounted for coupling to external circuitry is presently accomplished by manual, semiautomatic and automatic lead wire bonding machines. A fine lead wire such as 1 mil diameter gold bonding wire is held in a capillary bonding tool so that the lead wire projects beyond the end of the tool. The bonding tool is mounted in a tool holder arm which is in turn a component of the movable bonding head of the bonding machine. The bonding tool is appropriately mounted over a strip of lead frames retained within the guides of the bonding machine work holder. At a finer level, the bonding tool is positioned over the metalized die pad of an integrated circuit chip mounted on one of the lead frames, and then over a lead frame finger.

Examples of such lead wire bonding machines include the Model 478, High Speed Tailless Thermocompression Ball Bonder, a manual or semi-automatic model manufactured by Kulicke & Soffa Industries, Inc. (K&S), Horsham, PA., 19044, described in U.S. Pat. No. 3,643,321; the K&S Model 1418/1419, Automatic High Speed Wire Bonder With Digital Bonding Head; and K&S Model 1482, Automatic Wire Bonder. Other examples of state of the art lead wire bonding machines are those of The Welding Institute, Abington, England, described in U.S. Pat. Nos. 4,323,759 and 4,098,447.

Bonding of lead wire between the die pad of integrated circuit chip and lead frame finger is generally accomplished by a ball bond wedge bond cycle. A spherical ball is formed at the end of the lead wire extending below the capillary bonding tool by, for example, arc discharge between the bonding wire and a shield or shroud electrode. After solidification, the metal ball at the end of the lead wire is brought into intimate contact with the metalized die pad and a bond is formed typically by application of ultrasonic bonding energy to the bonding tool. Thermocompression is also utilized during bonding by maintaining the work holder at an elevated temperature and by applying a specified first bond force to the bonding tool.

The capillary bonding tool is then raised to a level above the ball bond and die with the lead wire feeding through the capillary passageway in the bonding tool. The bonding tool and lead frame are then moved relative to each other for bonding of a segment of the lead wire spaced from the ball bond at another location on a lead frame finger. At this new location the lead wire is brought into intimate contact with the surface of a lead frame finger to form a so-called "wedge bond" or "weld". The wedge bond is formed by the side tip of the bonding tool bearing down on the lead wire against the surface of the lead frame finger with a second bond force. Again, the bond is typically formed by application of ultrasonic bonding energy to the bonding tool. Thermocompression also operates to form the wedge bond. Typically the second bond force applied to the bonding tool for the wedge bond or weld is different from and greater than the first bond force applied to the bonding tool for ball bonding.

In the case of both the ball bond and wedge bond the application of ultrasonic bonding energy to the bonding tool is terminated before further movement of the tool. The joining of the bonded or welded surfaces is therefore completed before the bonding tool is raised. The lead wire is then severed just above the wedge bond by clamping the lead wire at a clamp on the bonding head and raising the bonding head, bonding tool and lead wire above the wedge bond so that the lead wire parts at the weakened neck adjacent to the wedge bond. Further background on ball bonding and wedge bonding can be found in the related cross referenced U.S. patent application Ser. No. 584,083, referred to above, U.S. patent application Ser. No. 470,217, filed Feb. 28, 1983 by applicants, and U.S. Pat. No. 4,390,771.

In performing a ball bond wedge bond cycle, the ball bonding machine typically applies a first bond force to the bonding tool during ball bonding in the order of, for example, 50 to 55 grams. During wedge bonding, a second bond force is applied to the bonding tool greater than the first bond force, for example, in the order of 100 grams or greater for pressing, weakening, and partially cutting the lead wire at the end of the wedge bond. The lead wire may then be cleanly severed or parted at the weakened edge by clamping the lead wire in the bonding head and raising the bonding head and bonding tool.

The first and second bonding forces at the bonding tool are typically applied by constant force appliances or methods such as the weight of components resting on the bonding tool or tool holder; application of specified spring tension to the bonding tool, tool holder, tool lifter or other supporting component; or the driving force of a drive motor applied to the bonding head tool holder, or supporting components. A disadvantage of presently available ball bonding machines is that the application of specified bonding force is constant throughout the bond or weld without variation of the force profile. Thus, the bond force cannot be varied during bonding to optimize the welding effect.

In U.S. Pat. No. 3,643,321 a wire bonding machine is described with provision for applying first and second constant bond forces for ball bonding and wedge bonding respectively. The tool holder moves freely in a vertical guide during ball bonding so that the first bond force on the bonding tool is determined by the constant weight of the tool holder bearing on the bonding ball.

The wire clamp positioned above the tool holder is normally open and movable relative to the tool holder for bearing against the tool holder. Above the wire clamp is a second bond force lever arm that is spring loaded. The second bond force lever arm is brought to bear under the tension of the spring against the wire clamp and tool holder during the subsequent wedge bond or weld. The second bond force is therefore the spring force in addition to the weight of the tool holder.

In either case, the first bond force comprising the weight of the tool holder and the second bond force comprising the cumulative weight of the tool holder plus the spring force on the second bond force lever arm apply a constant force throughout ball bonding on the one hand and wedge bonding on the other. There is no variation of the first bond force for different die pad locations on the chip nor is there variation in the second bond force according to differences in lead frame fingers. Furthermore, the force profile is constant in either case and the applied force may not be controlled or varied during a particular bond or weld.

A diagrammatic representation of another prior art K&S bonding machine is shown in FIGS. 1 and 2. The schematically represented bonding tool 10 is supported in a tool holder or tool holding arm 12 which in turn constitutes part of the movable bonding head of the bonding machine. A tool holder lifter or tool holder lifting arm 14, also part of the bonding head, raises and lowers the tool holder 12 but with some play or relative movement between the tool holder lifter 14 and tool holder 12. During downward movement the tool holder lifter 14 and tool holder 12 are coupled by a spring coupling 15 having a spring constant K selected to impart a desired bonding force to the bonding tool 10. The tool holder lifter 14 is raised and lowered by a motor driven cam 16 through a connecting rod 17 and related linkages and couplings. Downward motion of the tool holder lifter 14 and tool holder 12 for ball bonding or wedge bonding is driven by connecting rod 17. The bonding tool is applied against the substrate 18, either the die pad of an integrated circuit chip or a lead frame finger, with the desired bonding force proportional to the spring constant K and the depth of compression of the spring which is in turn determined by the stroke of rod 17 preset for the machine. The stroke of rod 17 is generally controlled by a servo motor control loop including an optical encoder position detector, the microprocessor of the bonding machine and a digital to analog converter for controlling the servo motor as further described in the related patent application referenced above.

The bonding tool 10 rests against the tool holder lifter 14 at electrical contacts 20 which are connected in an electrical circuit not shown which provides an electrical sensor. The electrical contacts 20 are closed during vertically upward motion of the bonding tool, that is during most of the upward stroke of connecting rod 17. Furthermore, the electrical contacts are closed during the downward stroke until the applied compressional force on the bond force spring 15 initiates compression of the spring separating the contacts 20 so that the contacts are open. The elements are typically constructed and arranged so that the contacts 20 open when the applied compressional force or bonding force reaches a level of, for example, in the order of 25 grams.

Upon opening of the contacts the electrical circuit and sensor not shown turns on the ultrasonic generator of the bonding machine and initiates application of ultrasonic bonding energy from the ultrasonic generator to the tool holder and bonding tool 10.

Yet another example of portions of a prior art bonding machine bonding head is shown diagrammatically in FIG. 3. In this example the tool holder 30 is mounted in a tool pivot casting 32 from which is suspended a harness 34. A first spring 35 is coupled under tension between the harness 34 and the first spring lever arm 36. The first spring 35 is selected to have the desired spring constant $K_1$ for applying the selected first bond force through the tool holder to the capillary bonding tool 38. Movably mounted above the tool holder 30 is a wire clamp pivot arm 40 having a wire clamp 42 mounted at the end which is normally open but which, after the wedge bond, clamps the bonding lead wire 44 while the tool holder 30 and wire clamp pivot arm 40 are raised thereby parting the lead wire at the weakened neck of a wedge bond.

Projecting above the wire clamp pivot arm is a second bond force lever or link 45 with a downward facing pressure surface 46 positioned for abutting against and bearing upon the pressure bearing surface 48 of wire clamp pivot arm 40. The second bond force lever or link 45 is provided with a harness 52 from which is suspended under tension the second spring 55 connected to second spring lever arm 56. The second force lifter arm 54 normally maintains the second bond force link 45 out of pressure contact with the surface 48 of wire clamp pivot arm 40, for example, during ball bonding. During wedge bonding the second force lifter 54 is lowered so that the spring force of second spring 55 is brought to bear against the wire clamp pivot arm 40 and hence the tool holder 30 and bonding tool 38. The second bond force is therefore the cumulative sum of the first bond force applied by the first spring 35 pulling down on tool holder 30 and the supplemental bond force brought to bear by the second spring 55 via second bond force link 45, wire clamp pivot arm 40, and tool holder 30.

In the ball bonding machine of this type the components of the bonding head, for example, the tool holder 30, wire clamp pivot arm 40, second bond force link 45, etc. are raised and lowered by cam rods operated by the main cam axis or shaft of the bonding machine. These cam rods and cam shaft are constructed and arranged so that camming surfaces lift the second bond force link 45 during ball bonding and lowers the second bond force link to rest on the wire clamp pivot arm and tool holder during the subsequent wedge bond or weld for cumulatively greater force. In either event, however, this conventional bonding machine bond force arrangement suffers the disadvantages noted above that the bond forces are constant in either event according to the springs selected and the force profile may not be varied during a bond or weld.

More recent models which use a drive motor and bond head crank for applying bond force are similarly limited. According to this arrangement, a bond head of the type illustrated in FIGS. 1 and 2 is provided in which the first bond force is determined by the selected spring constant and spring displacement tension of a spring loading element between the tool holder and tool holder lifter. The bond force is applied from a drive motor through a motor crank, ball joint and connecting rod to the tool holder lifter for displacing the spring between the tool holder lifter and tool holder a programmed amount for applying the desired constant bond force at the bonding tool.

OBJECTS OF THE INVENTION

It is therefore an object of the present invention to provide improved bonding of lead wire between an integrated circuit chip and a lead frame by variation and control of the first bond force applied during ball bonding and the second bond force applied during wedge bonding.

Another object of the invention is to provide a new bonding machine and method in which the bond force profile of the first bond force and second bond force may be rapidly varied during ball bonding and wedge bonding according to a desired force profile to achieve optimum welding between the adjacent surfaces.

A further object of the invention is to provide variable and programmable electrical control over the amplitude, duration and profile of bond force at different bonding sites during ball bonding on die pads at different locations and during wedge bonding on lead frame fingers of different characteristics for optimum welding and bonding according to the context.

DISCLOSURE OF THE INVENTION

In order to accomplish these results, the invention provides an improved lead wire ball bonding machine of the type having a movable bonding head comprising an elongate tool holder and a capillary bonding tool secured in the tool holder for ball bonding the end of a lead wire held in the bonding tool to a die pad of an integrated circuit chip and for wedge bonding a segment of the lead wire spaced from the ball bond to a lead frame finger during successive ball bond wedge bond cycles. The invention incorporates a number of prior art elements including bonding machine logic control circuitry or a bonding machine microprocessor generating control signals for initiating and timing steps in the ball bond wedge bond cycle.

In the improvement of the lead wire ball bonding machine according to the invention, the apparatus for applying selected bond force comprises a solenoid coupled to the bonding head for applying the first and second bond forces to the bonding tool for ball bonding and wedge bonding during successive ball bond wedge bond cycles. The invention also provides a solenoid control circuit coupled to the solenoid and constructed and arranged to actuate the solenoid by delivering a first current having a desired profile or amplitude wave envelope for applying the first bond force with a first force profile during ball bonding to die pads, and by delivering a second current having a desired profile or amplitude wave form for applying the second bond force with a second force profile during wedge bonding to lead frame fingers.

The solenoid may be coupled to the bonding head at any of several locations according to the type of ball bonding machine into which it is retrofitted. For example, according to one embodiment, the bonding head comprises an elongate tool holder lifter movably engaging the tool holder for raising and lowering the tool holder. The solenoid may be coupled between the tool holder and tool holder lifter. According to another embodiment, the solenoid is connected between the tool holder and a fixed frame of the bonding head or bonding machine.

In a preferred form of the invention the solenoid control circuit includes a wave form generator for generating wave form envelopes having desired wave form amplitude profiles, a DC power supply for delivering current, and an amplifier gate coupled to the wave form generator and DC power supply for modulating the current amplitude delivered by the DC power supply in accordance with the wave form generator wave form profiles. The amplifier gate is coupled to the solenoid for delivering the modulated current to the solenoid. As a result, the first and second bond force profiles are modulated in accordance with the wave form amplitude profiles of the current actuating the solenoid. Furthermore, the solenoid control circuit may comprise a processor programmable for delivering different current wave form profiles at different successive ball bond and wedge bond sites to effect the desired bond force profiles.

A feature and advantage of this arrangement is that the first bond force may be custom varied and modulated according to the welding requirements at different die pads while the second bond force profile may be varied and modulated according to the welding requirements of different lead frame fingers. In each instance the bond force profile is selected to implement a desired variation in bond force during a particular ball bond or wedge bond. The bond force may also be varied according to the composition of the constituent metals of the lead wire and bonding substrate, and according to the prevailing temperature and applied ultrasonic bonding energy.

More generally, the present invention contemplates providing a variable linear drive coupled to the bonding head for applying selected first and second bond forces to the bonding tool for ball bonding and wedge bonding during successive ball bond wedge bond cycles. The variable linear drive may be, for example, a variable drive linear motor or a solenoid for delivering first and second bond forces with selective force profiles. The variable linear drive is actuated by a control circuit which modulates the current to the variable linear drive for achieving the desired force profile at any particular ball bond or wedge bond site.

Other objects, features, and advantages of the invention are set forth in the following specification and accompanying drawings.

DESCRIPTION OF PREFERRED EXAMPLE EMBODIMENTS AND BEST MODE OF THE INVENTION

Figure 1:
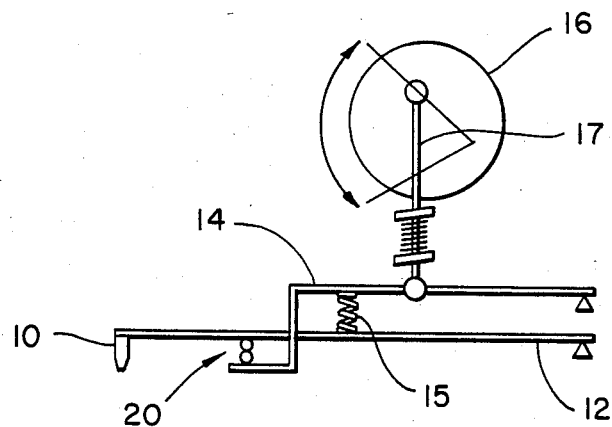
FIG. 1 is a diagrammatic view of portions of a prior art bonding machine bond head with the tool lifter in raised position and electrical sensor contacts closed.
Figure 2:
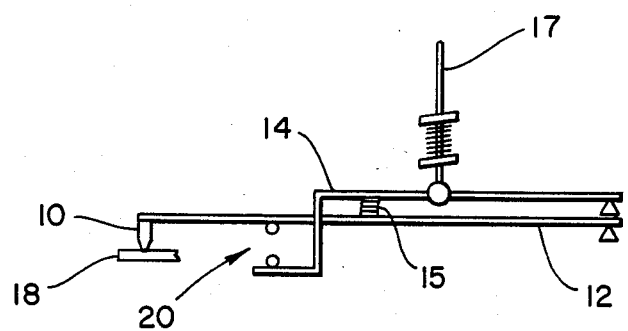
FIG. 2 is a diagrammatic view of the prior art bonding machine elements of FIG. 1 with the tool holder in lowered position with the electrical sensor contacts open.
Figure 4:
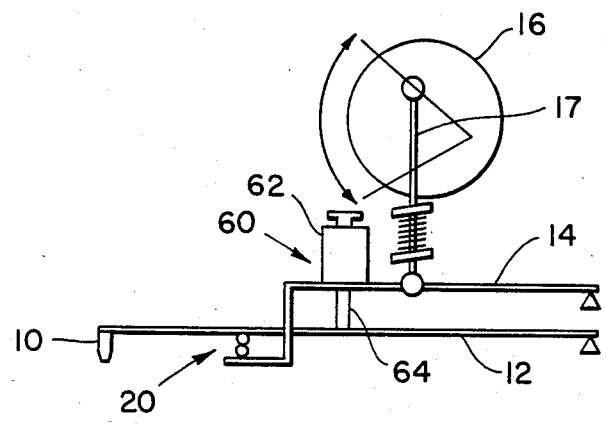
FIG. 4 is a diagrammatic view of portions of a bonding machine and bonding head according to the invention with variable bond force solenoid coupled between the tool lifter and tool holder.

A bonding head of the type illustrated in FIGS. 1 and 2, modified and retrofitted in accordance with the present invention is illustrated in FIG. 4. In this example, the elements of the bonding head corresponding to the elements of FIGS. 1 and 2 are designated by the same reference numerals. However, as shown in the example of FIG. 4, the spring coupling 15 between the tool holder 12 and tool holder lifter has been removed. In its place there is installed a bond force solenoid 60 in accordance with the present invention with the solenoid cylinder or body 62 fixed and mounted on the tool holder lifter 14 and the solenoid armature or piston 64 connected to the tool holder 12. A springless solenoid without a return spring may be selected for the solenoid 60 so that the armature or piston 64 moves freely in the solenoid housing 62 when the solenoid is inactivated. When connecting rod 17 reaches the depth of its drive, that is the position comparable to FIG. 2, the solenoid 60 is then actuated with a current having a selected current amplitude wave form or profile to effect the desired bond force profile at the bonding tool 10 as hereafter described.

In the example of FIG. 4, a coupling spring 15 of the type illustrated in FIGS. 1 and 2 but with a low spring constant may be retained between the tool holder and tool lifter 14 to maintain a stable mechanical relationship or bias between the tool holder 12 and lifter 14. Alternatively, a biasing spring with a low spring constant may be included in the solenoid 60.

Figure 5:
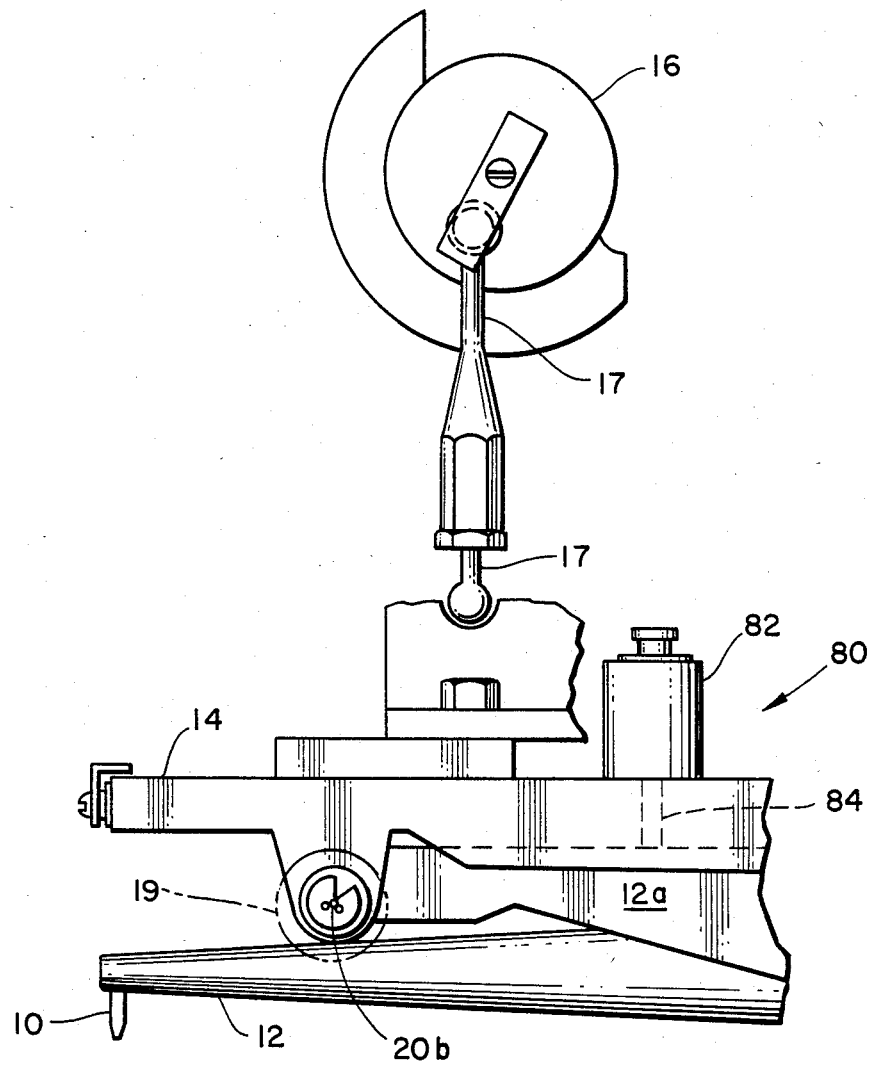
FIG. 5 is a diagrammatic view of another bonding head according to the invention with bond force solenoid coupled between the tool lifter and tool holder.
Figure 5A:
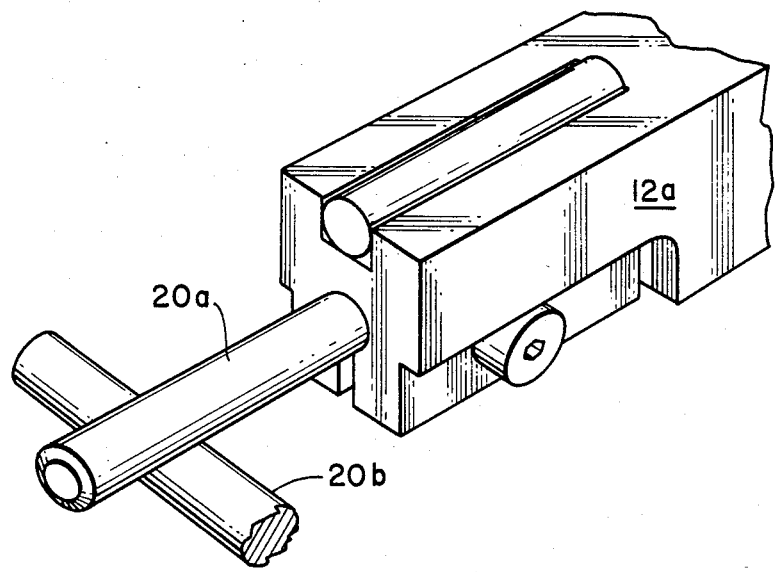
FIG. 5A is a detailed perspective view of a fragmentary portion of the bonding head in the phantom circle of FIG. 5 showing the electrical and mechanical contact between the tool holder and tool lifter.

A side view of a fragmentary portion of an actual bond head corresponding to the bond heads shown diagrammatically in FIGS. 1 and 2 but also modified in accordance with the invention as shown in FIG. 5. The elements corresponding to the bond head elements shown in the diagrammatic views of FIGS. 1 and 2 and also of FIG. 4 are designated by the same reference numerals. In the actual bond head the tool holder 12 is provided with a fixed arm 12a parallel to the tool holder 12 at the end of which one of the electrical contacts 20 is mounted. A detailed view of the actual electrical contacts within the region of the phantom circle 19 of FIG. 5 but hidden from view in FIG. 5 is shown in FIG. 5A. Electrical contact 20a at the end of the parallel tool holder arm 12a engages the electrical contact 20b connected to the tool holder lifter 14. Thus, in actual practice, according to the prior art, the electrical contacts 20a and 20b are rods engaging each other at right angles with the electrical contact rod 20b fixedly connected to the tool holder lifter 14 while the electrical contact 20a is fixedly connected to the tool holder 12 by way of the parallel but fixed tool holder arm 12a. In the example of FIG. 5, according to the present invention, a bond force solenoid 80 couples the tool holder lifter 14 and tool holder 12 with the solenoid housing or cylinder 82 mounted on and fixed to the lifter 14 and the solenoid armature or piston 84 connected to the parallel tool holder arm 12a which is in turn fixed to the tool holder 12. The bond force solenoid 80 operates in the same manner as the bond force solenoid 60 described with reference to FIG. 4. However, the location of solenoid 80 is on the side of the connecting rod 17 opposite the bonding tool 10 in FIG. 5.

Figure 6:
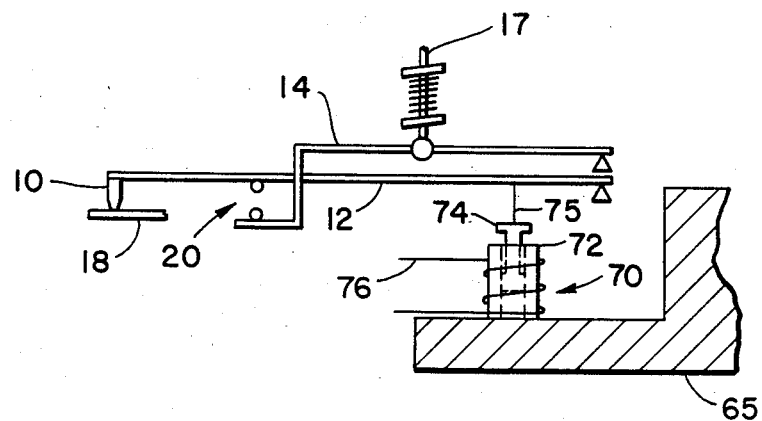
FIG. 6 is a diagrammatic view of portions of a bonding machine bonding head, according to the invention, with variable bond force solenoid coupled between the tool holder and a fixed frame of the bonding head or bonding machine.

An alternative retrofitting arrangement according to the present invention for a bond head of the type illustrated in FIGS. 1 and 2 is shown in FIG. 6. In this example the corresponding elements are again designated by the same reference numerals. A variable linear bond force drive in the form of solenoid 70 is coupled between the tool holder 12 and a fixed frame 65 of the bonding head or bonding machine. The solenoid body or cylinder 72 is fixed and mounted on the frame 65 while the solenoid armature or piston 74 is connected to the tool holder 12 by a cable, arm, or other link 75. A springless solenoid may be used for solenoid 70 for free movement of the armature 74 in the solenoid housing 72 when the solenoid is inactivated and the tool holder 12 is raised by the tool holder lifter 14. When the connecting rod 17 is extended so that the electrical contacts 20 are open and the tool holder 10 is brought to bear on a substrate 18 such as a die pad or lead frame finger, the solenoid 70 is actuated by selected current on the solenoid leads 76. The actuating current is selected and modulated as hereafter described to have a desired amplitude wave form or profile for delivering the desired bond force profile at the bonding tool 10 and substrate 18 as hereafter further described.

Figure 3:
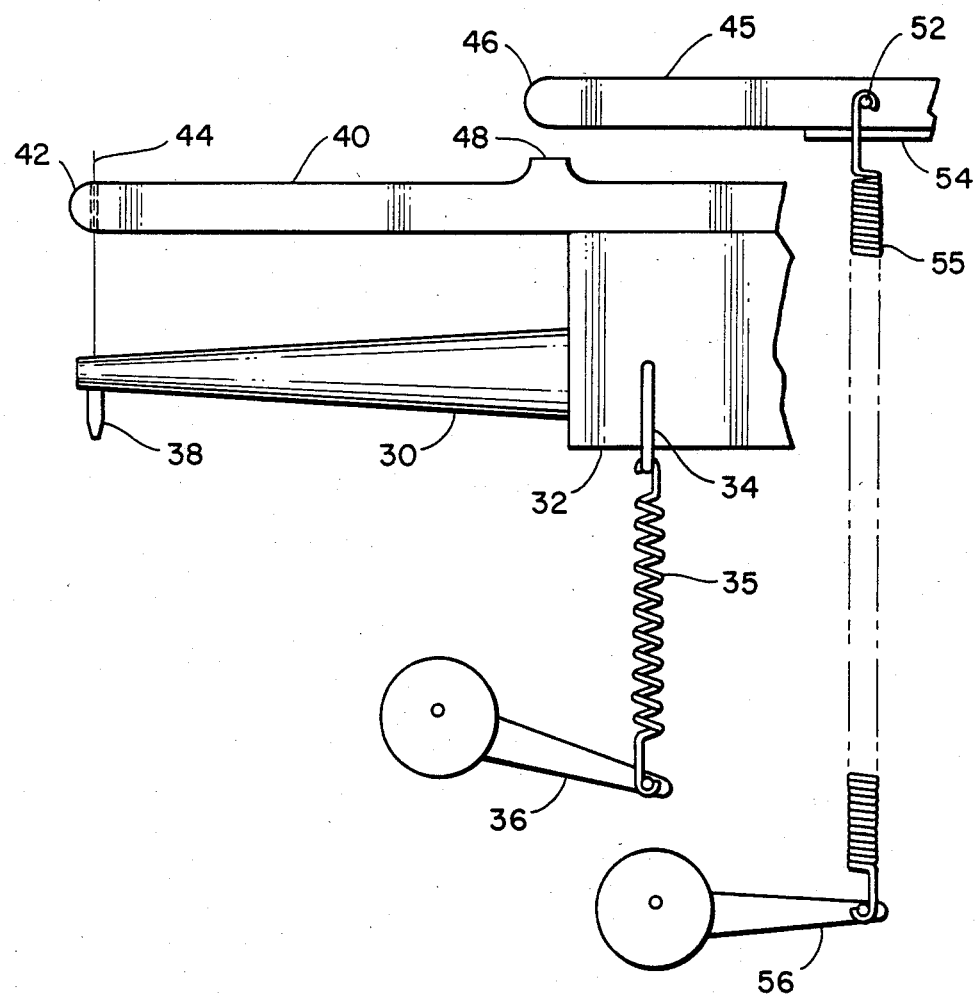
FIG. 3 is a diagrammatic view of portions of another prior art bonding machine bonding head.
Figure 7:
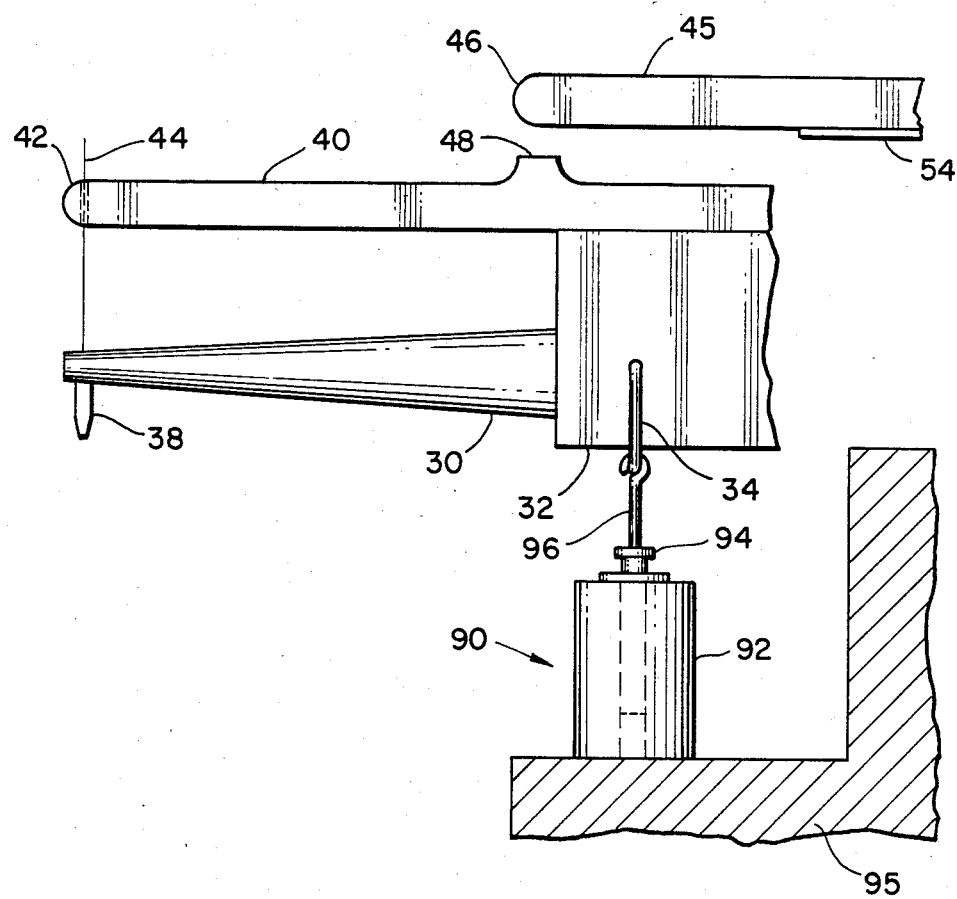
FIG. 7 is a diagrammatic view of portions of another bonding machine and bonding head according to the present invention for variation and control of bond force using a bond force solenoid between the tool holder and a fixed frame.

In yet another exemplary arrangement a bond head or bonding head of the type illustrated in FIG. 3 is modified and retrofitted in accordance with the present invention as shown in FIG. 7. The elements of FIG. 7 corresponding to those of FIG. 3 are designated by the same reference numerals. In the example of FIG. 7, however, the first bond force spring 35 has been removed from the tool holder 30 and pivot casting 32 and the second bond force spring 55 has been removed from the second bond force lever or link 45. In place of the bond force spring 35 the present invention provides a variable linear bond force drive in the form of the bond force cylinder 90. The solenoid housing or cylinder 92 of the solenoid 90 is mounted on a fixed frame 95 of the bond head or bonding machine while the solenoid armature or piston 94 is coupled to the harness 34 of pivot casting 32 of the tool holder 30 by the connecting link 96. Both the first bond force and the second bond force are applied by solenoid 90 and the second bond force lever 45 is effectively inactivated by the removal of the second spring 55. As heretofore described a springless solenoid without a return spring may be selected for solenoid 90 for free movement of the armature 94 within the solenoid housing 92 when the solenoid is inactivated. With the bond head in its extended or lowered position in preparation for bonding of a lead wire 44 held in the bonding tool 38 to a substrate, the solenoid 90 is actuated to apply the bond force of desired force profile according to the wave form of the current applied to solenoid 90 as hereafter described.

In each of the foregoing examples, the preferred embodiment has been described using a solenoid for the variable linear drive for implementing the desired bond force profile at the bonding tool of the bond head. Alternatively, however, a small variable drive linear motor may be used to implement the desired force profile.

Figure 8:
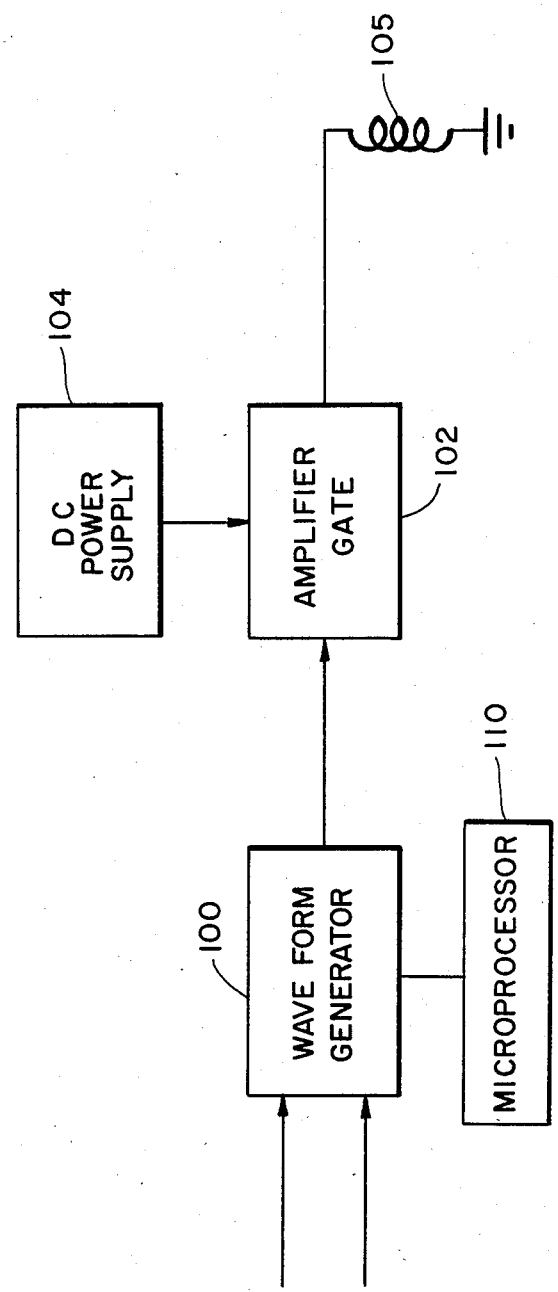
FIG. 8 is a schematic block diagram of a solenoid control circuit according to the invention.

In order to achieve the desired bond force profile, the invention provides a solenoid control circuit or variable linear drive control circuit of the type illustrated in FIG. 8. According to this control circuit, there is provided a wave form generator 100 for generating and delivering variable wave forms of the type, for example, illustrated in FIG. 9 to an amplifier gate 102 which may be, for example, an amplifier transistor gate. A DC power supply 104 provides the current for actuating a solenoid coil 105 of one of the bond force solenoids heretofore described. The current delivered by DC power supply 104, however, is modulated by the amplifier gate 102 in accordance with the wave form envelope applied by the wave form generator 100. As a result, the actuating current applied to the solenoid coil 105 of one of the bond force solenoids or other variable linear drive has a current amplitude profile for achieving the desired force profile at the solenoid armature and for applying the desired force profile at the bonding tool.

The control circuit of FIG. 8 may also include a microprocessor 110 for programming the wave form generator to deliver different wave forms at different ball bond and wedge bond sites during the ball bond wedge bond cycles.

Figure 9:
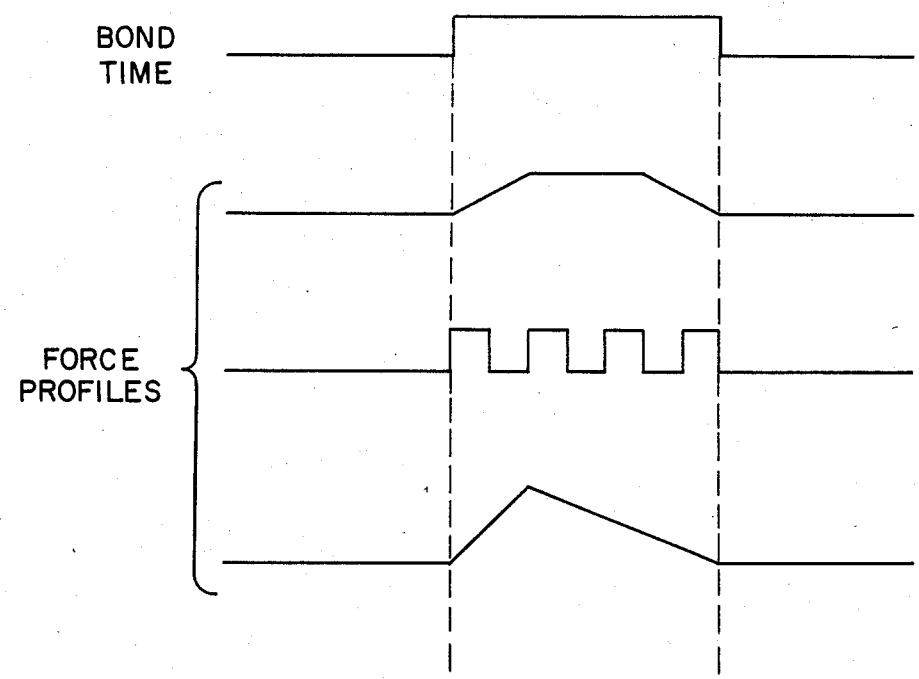
FIG. 9 is a graph of example current profiles delivered to the solenoid and consequent bond force profiles applied by the solenoid.

As shown in FIG. 9, the wave forms generated by the wave form generator 100, the corresponding current amplitude profiles, and therefore the resulting force profiles at the bonding tool may exhibit a variety of configurations for optimizing the weld or bond according to the characteristic parameters of the bond site. Thus, for example, the force profile may increase or decrease in a ramp configuration, square wave configuration, pulse configuration, and may include a trapezoidal flat top configuration, sinusoidal configuration, etc.

While the invention has been described with reference to particular example embodiments, it is intended to cover all modifications and equivalents within the scope of the following claims.

We claim:

1. An improved lead wire ball bonding machine having a movable bonding head comprising an elongate tool holder and a capillary bonding tool secured in the tool holder for ball bonding the end of a lead wire held in the bonding tool to a die pad of an integrated circuit chip and for wedge bonding a segment of the lead wire spaced from the ball bond to a lead frame finger during successive ball bond wedge bond cycles, bond force means for applying first bond force at the bonding tool during ball bonding and for applying second bond force at the bonding tool during wedge bonding, bonding machine logic control means generating control signals for initiating and timing steps in the ball bond wedge bond cycle, wherein the improvement comprises:

said bond force means comprising solenoid means coupled to the bonding head for applying said first and second bond forces to the bonding tool for ball bonding and wedge bonding respectively during successive ball bond wedge bond cycles;

solenoid control circuit means coupled to said solenoid means and constructed and arranged to actuate said solenoid by delivering a first current having a first current amplitude profile for applying said first bond force with a first force profile during ball bonding to die pads and by delivering a second current having a second current amplitude profile for applying said second bond force with a second force profile during wedge bonding to lead frame fingers;

and processor means coupled to the solenoid control circuit means to provide programmed variation in the first current amplitude profile and first force profile of the first bond force for different die pads of an integrated circuit chip and for providing variation in the second current amplitude profile and second force profile of the second bond force for different lead frame fingers.

2. The bonding machine of claim 1 wherein said bonding head further comprises an elongate tool holder lifter movably engaging the tool holder for raising and lowering the tool holder and bonding tool secured in the tool holder, and wherein said solenoid means is coupled between said tool holder and tool holder lifter.

3. The bonding machine of claim 1 wherein said bonding machine further comprises a fixed frame means and wherein said solenoid means is coupled between the tool holder and said fixed frame means.

4. The bonding machine of claim 1 wherein said bonding head comprises in addition to the elongate tool holder, an elongate wire clamp pivot arm movably mounted in the bonding head above the tool holder for limited independent movement up and down relative to the tool holder and for bearing against the tool holder in the down position, and wherein the bond force means comprises said solenoid means coupled between the wire clamp pivot arm and the tool holder.

5. The bonding machine of claim 1 wherein said solenoid control circuit means further comprises variable control means for modulating the first current amplitude profile and first bond force profile and for modulating the second current and second bond force profile and wherein said solenoid control circuit means and variable control means are constructed and arranged for modulating the first and second current amplitude profiles and first and second bond force profiles to provide a variety of bond force profile wave forms.

6. The bonding machine of claim 5 wherein said variable control means comprises a wave form generator.

7. The bonding machine of claim 5 wherein said bond force profile wave forms comprise square wave forms.

8. The bonding machine of claim 5 wherein said bond force profile wave forms comprise ramp wave forms.

9. The bonding machine of claim 5 wherein said bond force profile wave forms comprise pulsed wave forms.

10. The bonding machine of claim 1 wherein said solenoid control circuit means comprises wave form generator means for generating wave form envelopes having desired wave form profiles, DC power supply means for delivering current, and amplifier gate means coupled to the wave form generator means and DC power supply means for modulating the current delivered by the DC power supply means in accordance with the wave form generator wave form profiles, said amplifier gate means coupled to the solenoid means for delivering the modulated current to the solenoid means whereby the first and second bond force profiles are modulated in accordance with said wave form profiles.

11. An improved lead wire ball bonding machine having a movable bonding head comprising an elongate tool holder and a capillary bonding tool secured in the tool holder for ball bonding the end of a lead wire held in the bonding tool to a die pad of an integrated circuit chip and for wedge bonding a segment of the lead wire spaced from the ball bond to a lead frame finger during successive ball bond wedge bond cycles, bond force means for applying first bond force at the bonding tool during ball bonding and for applying second bond force at the bonding tool during wedge bonding, bonding machine logic control means generating control signals for initiating and timing steps in the ball bond wedge bond cycle, wherein the improvement comprises:

said bond force means comprising variable linear drive means coupled to the bonding head for applying said first and second bond forces to the bonding tool for ball bonding and wedge bonding respectively during successive ball bond wedge bond cycles;

control circuit means coupled to said variable linear drive means and constructed and arranged to actuate said variable linear drive means by delivering a first current having a first current amplitude profile for applying said first bond force with a first force profile during ball bonding to die pads and by delivering a second current having a second current amplitude profile for applying said second bond force with a second force profile during wedge bonding to lead frame fingers;

and processor means coupled to the control circuit means to provide variation in the first current amplitude profile and first force profile of the first bond force for different die pads of an integrated circuit chip and for providing variation in the second current amplitude profile and second force profile of the second bond force for different lead frame fingers.

12. The bonding machine of claim 11 wherein said bonding head further comprises an elongate tool holder lifter movably engaging the tool holder for raising and lowering the tool holder and bonding tool secured in the tool holder, and wherein said variable linear drive means is coupled between said tool holder and tool holder lifter.

13. The bonding machine of claim 11 wherein said bonding machine further comprises a fixed frame and wherein said variable linear drive means is coupled between the tool holder and said fixed frame means.

14. The bonding machine of claim 11 wherein said bonding head comprises in addition to the elongate tool holder, an elongate wire clamp pivot arm movably mounted in the bonding head above the tool holder for limited independent movement up and down relative to the tool holder and for bearing against the tool holder in the down position, wherein the bonding machine comprises a fixed frame and wherein the bond force means comprises said variable linear drive means coupled between the wire clamp pivot arm and the fixed frame.

15. The bonding machine of claim 11 wherein said control circuit means further comprises variable control means for varying the first current amplitude profile and first bond force profile and for varying the second current amplitude profile and second bond force profile and wherein said control circuit means and variable control means are constructed and arranged for modulating the first and second currents and first and second bond force profiles to provide a variety of bond force profile wave forms.

16. The bonding machine of claim 15 wherein said bond force profile wave forms comprise square wave forms.

17. The bonding machine of claim 15 wherein said bond force profile wave forms comprise ramp wave forms.

18. The bonding machine of claim 11 wherein the variable linear drive means comprises a linear motor.

* * * * *